(12) United States Patent
Krause

(10) Patent No.: US 6,400,630 B2
(45) Date of Patent: Jun. 4, 2002

(54) CIRCUIT CONFIGURATION HAVING A VARIABLE NUMBER OF DATA OUTPUTS AND DEVICE FOR READING OUT DATA FROM THE CIRCUIT CONFIGURATION WITH THE VARIABLE NUMBER OF DATA OUTPUTS

(75) Inventor: Gunnar Krause, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/766,321

(22) Filed: Jan. 19, 2001

(30) Foreign Application Priority Data

Jan. 19, 2000 (DE) .......................................... 100 02 082

(51) Int. Cl.⁷ ................................................. G11C 7/00
(52) U.S. Cl. .................... 365/221; 365/194; 365/189.12
(58) Field of Search ................................ 365/221, 194, 365/154, 189.12, 233

(56) References Cited

U.S. PATENT DOCUMENTS

| 4,224,531 A | * | 9/1980 | Ebihara et al. | ............. 307/221 |
| 4,672,647 A | | 6/1987 | Yamaguchi et al. | |
| 4,890,261 A | | 12/1989 | Hidaka et al. | |
| 4,961,169 A | * | 10/1990 | Matsumura et al. | ... 365/189.12 |
| 5,025,419 A | * | 6/1991 | Nishino | .................... 365/221 |
| 5,862,146 A | | 1/1999 | Chen et al. | |
| 5,867,422 A | | 2/1999 | John | |

FOREIGN PATENT DOCUMENTS

DE          30 32 298 A1      6/1981

OTHER PUBLICATIONS

U. Tietze et al.: "Halbleiter–Schaltungstechnik" [semiconductor circuit technology], Springer Verlag, Berlin, 3$^{rd}$ ed. 1976, chapter 18.6.1, pp. 550,551.

* cited by examiner

Primary Examiner—Huan Hoang
(74) Attorney, Agent, or Firm—Laurence A. Greenberg; Werner H. Stemer; Gregory L. Mayback

(57) ABSTRACT

A circuit configuration is described which provides the advantage that data can be read out of a serially readable data memory via a freely selectable number of existing data outputs. This is advantageously achieved in that the serial data are routed with a delay effected by memory/delay circuits to a plurality of data outputs.

15 Claims, 2 Drawing Sheets

CIRCUIT CONFIGURATION HAVING A VARIABLE NUMBER OF DATA OUTPUTS AND DEVICE FOR READING OUT DATA FROM THE CIRCUIT CONFIGURATION WITH THE VARIABLE NUMBER OF DATA OUTPUTS

BACKGROUND OF THE INVENTION

Field of the Invention

The invention relates to a circuit configuration containing a data memory, a data output and a clock generator interconnected with the data memory. The invention further relates to a device for reading out data from the circuit configuration. The device contains a data memory, a control circuit connected to the data memory and a predefined number of data inputs through which the data can be read.

A corresponding circuit configuration and a corresponding device for reading out data from the circuit configuration are known from the field of memory modules. A data memory in which data relating to the memory modules are stored is provided in a memory module. The data are read out by a test device and used in test programs in order, for example, to check for correct functional capability of the memory module.

SUMMARY OF THE INVENTION

It is accordingly an object of the invention to provide a circuit configuration having a variable number of data outputs and a device for reading out data from the circuit configuration with the variable number of data outputs which overcomes the above-mentioned disadvantages of the prior art devices of this general type, With the foregoing and other objects in view there is provided, in accordance with the invention, a circuit configuration. The circuit configuration contains a serially readable data memory, a first data output, an output line connecting the first data output to the data memory, a clock generator outputting clock signals, and a clock line connecting the clock generator to the data memory. The circuit further contains a second data output and a memory/delay circuit having an input connected to the output line and an output connected to the second data output. The data memory outputs a data item stored therein onto the output line when a clock signal is received from the clock generator, the data item output by the data memory is passed on, with a time delay, through the memory/delay circuit to the second data output.

The object of the invention relates to an improved circuit configuration with which data can be read out from the data memory via an adjustable number of data outputs. A further object of the invention relates to the device for reading out data from a circuit configuration with an adjustable number of data outputs.

An advantage of the circuit configuration is the fact that the data that are to be read out are present in a chronologically offset form at a plurality of data outputs. This makes it possible both to read out all the data serially via a single data output or to read out the data simultaneously in parallel via a plurality of data outputs.

The device for reading out the data has the advantage that the data can be read in serially and/or in parallel via a variable number of data inputs. This provides a high level of flexibility when reading out data.

It is particularly advantageous to dispose a memory/delay circuit between the data memory and a data path circuit. This configuration provides the advantage that only the data that are output from the defined data memory are transmitted with a delay to the data path circuit. Other data that are transmitted to the outside from other data memories via the data path circuit are not affected by this circuit configuration.

A preferred embodiment of the memory/delay circuit is obtained by using a master/slave flip-flop that makes possible a cost-effective memory/delay circuit that operates with a high degree of reliability.

A control unit preferably supplies the memory/delay circuit with a control signal that enables the functioning of the memory/delay circuit. In this way, the memory/delay circuit becomes active only if the data are actually output from the data memory, as a result of which unnecessary power consumption is avoided.

A preferred embodiment of the circuit configuration is that the circuit configuration is integrated on a memory module. As a result of the circuit configuration according to the invention, the multiplicity of data outputs which are present on a memory module in order to read out data are used in a flexible and efficient way for reading out data from a serial data memory. The circuit configuration according to the invention can thus be integrated in a memory module without significant additional costs.

In accordance with an added feature of the invention, the memory/delay circuit is connected to the clock line, and the memory/delay circuit outputs the data item to the second data output with a delay of one clock signal.

In accordance with an additional feature of the invention, the memory/delay circuit is a first memory/delay circuit and a third data output is provided. A second memory/delay circuit having a first input connected to the output of the first memory/delay circuit, a second input connected to the clock line, and an output connected to the third data output, is provided. The data item supplied by the first memory/delay circuit is passed on, with a delay of one clock signal, by the second memory/delay circuit to the third data output.

In accordance with another feature of the invention, a data path circuit is connected to the memory/delay circuit via which data are fed to the first data output and the second data output.

In accordance with a further feature of the invention, the memory/delay circuit is a master-slave flip-flop circuit.

In accordance with another added feature of the invention, there is a control unit and a control line connecting the control unit to the data memory. The control unit enables an outputting of the data item from the data memory with a predefined control signal.

In accordance with another further feature of the invention, there is a control unit and a control line connecting the control unit to the memory/delay circuit, the control unit enables the passing on of the item data.

With the foregoing and other objects in view there is provided, in accordance with the invention, an integrated circuit. The circuit contains a memory module and a circuit configuration integrated on the memory module. The circuit configuration contains a serially readable data memory containing information relating to the memory module, a first data output, an output line connecting the first data output to the data memory, a clock generator outputting clock signals, a clock line connecting the clock generator to the data memory, a second data output, and a memory/delay circuit. The memory/delay circuit has an input connected to the output line and an output connected to the second data output. The data memory outputs a data item stored therein onto the output line when a clock signal is received from the clock generator. The data item output by the data memory is passed on, with a time delay, through the memory/delay circuit to the second data output.

With the foregoing and other objects in view there is provided, in accordance with the invention, a device for reading out data from a circuit configuration. The device includes a predefined number of data inputs through which the data can be read in, a data memory, and a control circuit connected to the data memory and to the data inputs. The data memory defines which of the data inputs are active, and the control circuit reads in the data in parallel via the data inputs.

In accordance with an added feature of the invention, the memory stores timing clock data that can be set and that the control circuit reads in the data in dependence on the timing clock data.

In accordance with a concomitant feature of the invention, the data memory stores a clock time, and in that a clock period is calculated from the number of the data inputs multiplied by the clock time.

Other features which are considered as characteristic for the invention are set forth in the appended claims.

Although the invention is illustrated and described herein as embodied in a circuit configuration having a variable number of data outputs and a device for reading out data from the circuit configuration with the variable number of data outputs, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
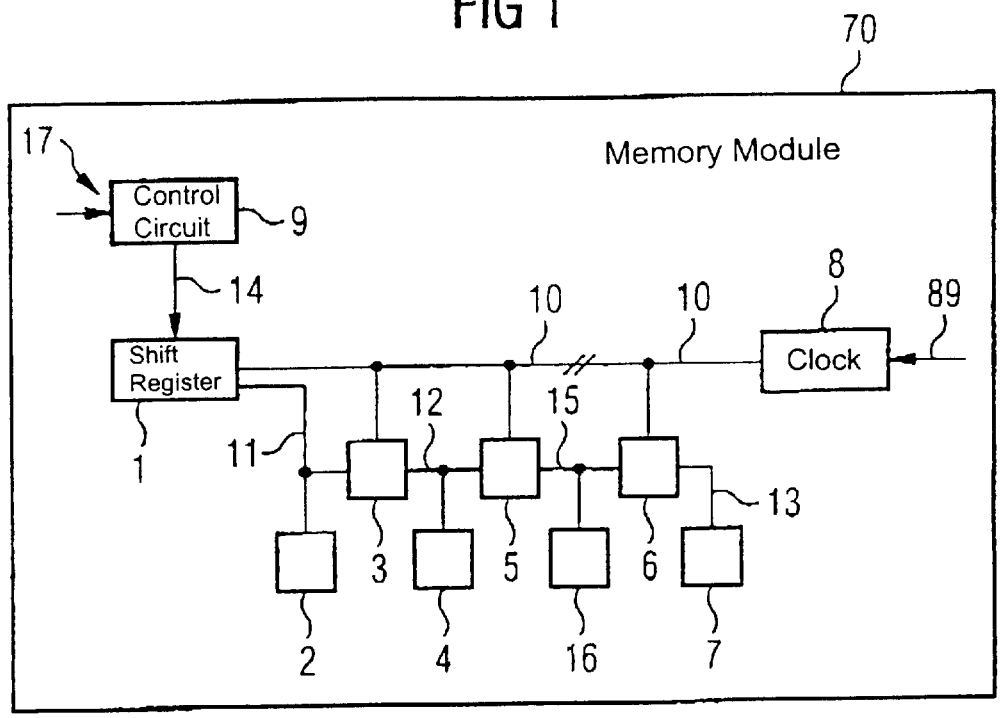
FIG. 1 is a block circuit diagram of a first circuit configuration with a serially readable data memory.

In all the figures of the drawing, sub-features and integral parts that correspond to one another bear the same reference symbol in each case. Referring now to the figures of the drawing in detail and first, particularly, to FIG. 1 thereof, there is shown a circuit configuration which is disposed on an integrated semiconductor module, in particular on a memory module 70. Further customary circuit components of the memory module, for example the memory, power supply, inputs and outputs etc. are not explicitly represented. The circuit configuration according to the invention can be used in any desired circuit configuration and is not restricted to the exemplary embodiment described.

The circuit configuration according to FIG. 1 shows a shift register 1 that represents a serial data memory. Instead of the shift register 1, it is possible to use any type of memory from which the stored data are read out serially. The shift register 1 is connected via a first control line 14 to a control circuit 9, via a first data line 11 to a first data output 2 and to a first memory/delay circuit 3. The control circuit 9 has a control input 17, by which the control circuit 9 can be switched to a read-out mode.

The first memory/delay circuit 3 is connected by a data output to a second memory/delay circuit 5 via a second data line 12 and to a second data output 4. The second memory/delay circuit 5 is connected via a third data line 15 to a third data output 16 and to a third memory/delay circuit 6. The third memory/delay circuit 6 is connected to a fourth data output 7 via a fourth data line 13.

The first, second, third and fourth data outputs 2, 4, 16, 7 are embodied, for example, as terminal pins of the semiconductor memory module 70. The first, second and third memory/delay circuits 3, 5, 6 are preferably embodied as master/slave flip-flops. However, any other type of memory/delay circuit by which data present at the input are output at the output delayed by a predefinable time can also be used.

The first, second and third memory/delay circuits 3, 5, 6 and the shift register 1 are connected to a clock circuit 8 via a clock line 10. The clock circuit 8 outputs clock signals via the clock line 10 at predefined time intervals, and thus makes available a time base to the circuits connected to the clock line 10. In a preferred embodiment, the clock circuit 8 can be driven by a clock input 89, so that the time intervals between the clock signals can be predefined from the outside, for example by a data-reading device.

Figure 2:
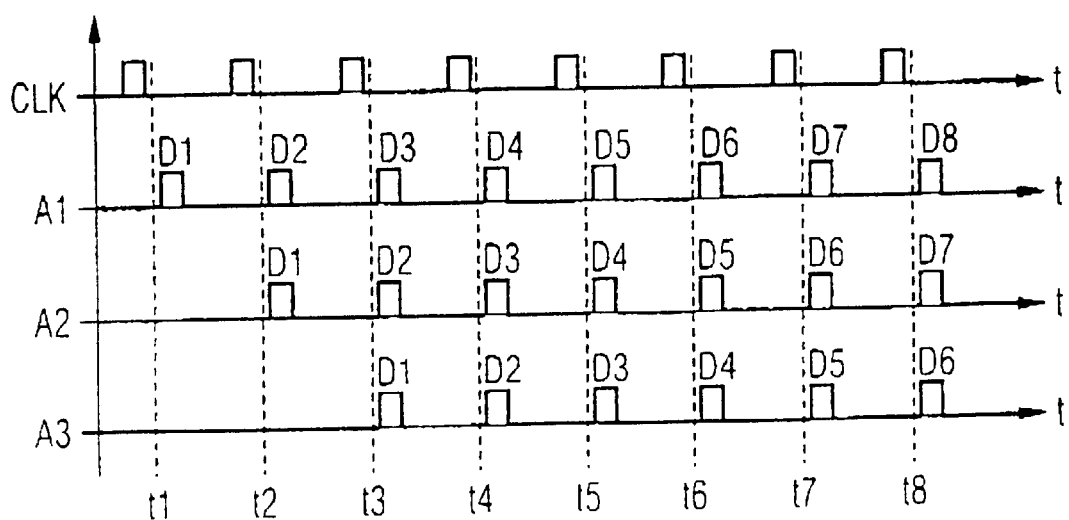
FIG. 2 is a timing diagram of a variation over time of data signals that are present at data outputs.

The method of operation of the circuit configuration in FIG. 1 is explained with reference to the timing diagram in FIG. 2. FIG. 2 shows on the chronological sequence of the clock signals CLK which are output by the clock circuit 8 at constant time intervals. On the second, third and fourth time axes, designated by A1, A2 and A3, the variation over time of the signal present at the first, second and third data outputs 2, 4, 16 is given.

The control circuit 9 receives, for example from a test circuit via the control input 17, a signal indicating that data ought to be read out of the shift register 1. In response, the control circuit 9 outputs an appropriate signal to the shift register 1 via the first control line 14.

At time t1, the shift register 1 receives the clock signal CLK and subsequently outputs the first data item D1 via the first data line 11. In this way, the first data item D1 is present at the first data output 2 just after the time t1, the data output 2 being designated by A1 in FIG. 2. At the same time, the first memory/delay circuit 3 receives the first data item D1 and stores the first data item D1 in a buffer. At the time t1, there is no signal present at the second, third and fourth data outputs 4, 16, 7 because the first data/delay circuit 3 buffers the data item D1 output by the shift register 1 and does not pass it on immediately.

The shift register 1 and the first memory/delay circuit 3 receive a second clock signal CLK at time t2. In response, the first shift register 1 outputs the second data item D2 to the first data output 2 and to the input of the first memory/delay circuit 3. After the second clock signal CLK has been received, the first memory/delay circuit 3 passes on the first data item D1, stored in the buffer, to the second data output 4 via the output and to the input of the second memory/delay circuit 5. Then, the first memory/delay circuit 3 stores the second data item D2 in the buffer. The second memory/delay circuit 5 stores the first data item D1 in a buffer.

At the time t2, the first data item D1 is therefore present at the second data output 4 that is designated by A2 in FIG.

2. At the same time, the second data item D2 is present at the first data output 2 at the time t2.

After a third clock signal CLK has been received at time t3, the shift register 1 outputs a third data item D3 to the first data output 2 and to the input of the first memory/delay circuit 3. After the third clock signal CLK has been received, the first memory/delay circuit 3 passes on the second data item D2 to the second data output 4 and to the second memory/delay circuit 5.

After the third clock signal CLK has been received, the second memory/delay circuit 5 passes on the first data item D1 to the third data output 16 and to the third memory/delay circuit 6. Subsequently, the second memory/delay circuit 5 stores the second data item D2 in its buffer. The third memory/delay circuit 6 stores the first data item D1 in its buffer.

In this way, at time t3, the third data item D3 is present at the first data output 2, the second data item D2 is present at the second data output 4 and the first data item D1 is present at the third data output 16.

The shift register 1, and the first, second and third memory/delay circuits 3, 5, 6 operate in an analogous way when further clock signals CLK are received. The chronological distribution of the data between the data outputs 2, 4 and 16 is illustrated in FIG. 2. For example, at time t6, the sixth data item D6 is present at the first data output 2, the fifth data item D5 is present at the second data output 4 and the fourth data item D4 is present at the third data output 16.

The circuit configuration according to FIG. 1 functions in such a way that all the data are output via the individual data outputs 2, 4, 16 and 7 in a serial chronological sequence. In addition, the data streams which are output serially via the data output 2, 4, 16, 7 are respectively offset with respect to one another by one timing clock, one timing clock being defined by the time interval between two successive clock signals CLK. In one development of the invention, the same data are output at the data outputs, offset with respect to one another by a definable number of timing clocks. To this end, the data are buffered for appropriate periods of time in the memory/delay circuits 3, 5, 6.

The circuit configuration according to FIG. 1 thus makes it possible to read out data from the shift register 1 in such a way that all the data are read out serially via a single data output. Any of the existing data outputs 2, 4, 16, 7 can be used to do this because the data are output serially at all of these data outputs.

It is, however, also possible to read out the data via a freely definable number of data outputs. If, for example, a data-reading device has three data inputs, the three data inputs can be connected to the first, second and third data outputs 2, 4, 16, and the data can be respectively read out at the times t3, t6, t9, etc. The time intervals between the two times at which the data are read out are equivalent to three timing clocks because the data are not to be read out twice, but rather the three data outputs 2, 4, 16 are accessed whenever new data are present at the three data outputs again.

If the data-reading device has two data inputs, the data can be read out, for example via the first and second data outputs 2, 4. To do this, the data are respectively read out at the times t2, t4, t6, etc. The distance between the times at which the data are read out contains two timing clocks. Two new data items are respectively present at the first and second data outputs 2, 4 after two timing clocks.

The circuit configuration according to FIG. 1 thus permits the data to be read out from the shift register 1 via any desired freely configurable number of data outputs 2, 41 16, 7. To do this, the data-reading device must simply select the appropriate timing clock in order to avoid duplicated reading out or a loss of data.

Figure 3:
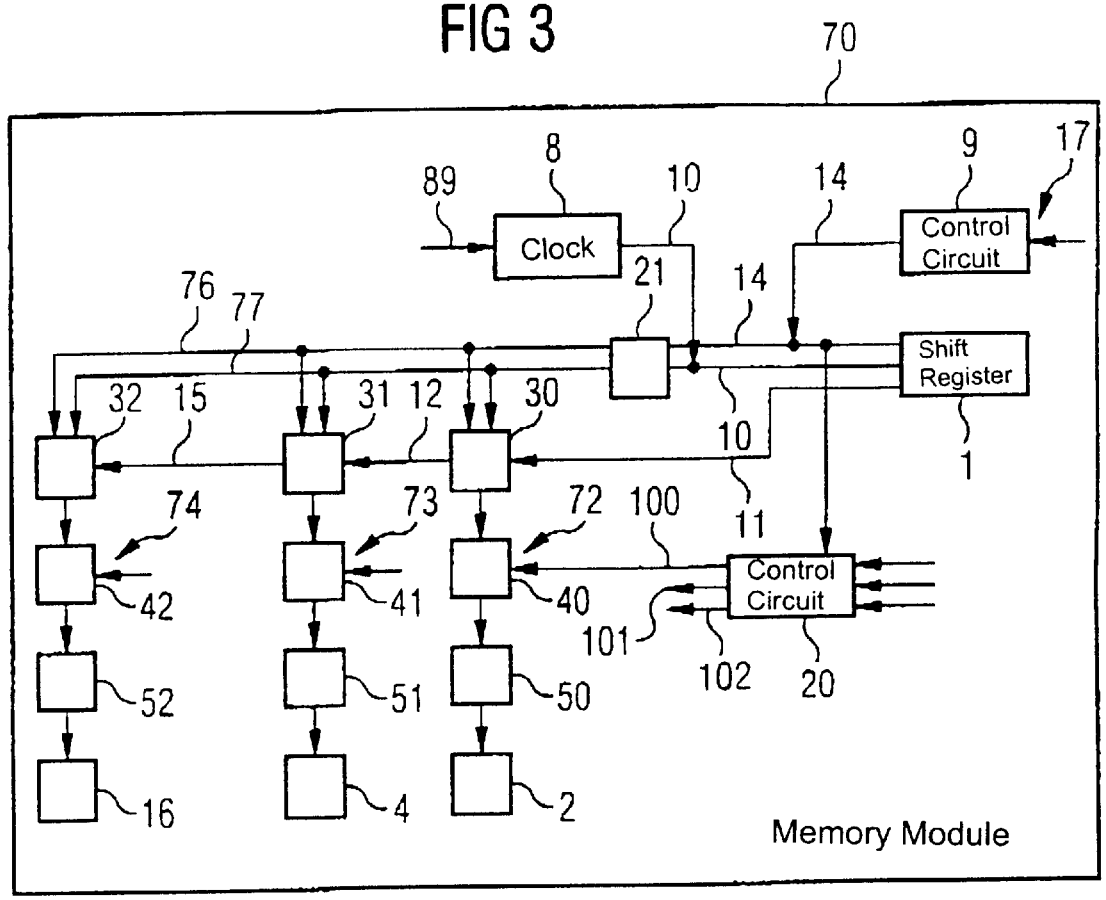
FIG. 3 is a block circuit diagram of a second circuit configuration with data path circuits.

FIG. 3 shows a circuit configuration that essentially corresponds to the circuit configuration in FIG. 1. Wherever the circuit configuration has identical components to those in FIG. 1, these are designated by the same reference numerals as in FIG. 1. The circuit configuration in FIG. 3 has, as basic structure, the clock circuit 8, the control circuit 9 and the shift register 1 which are connected to one another via the clock line 10 and the first control line 14.

In addition, a masking circuit 21 is provided which is connected via the clock line 10 to the clock circuit 8 and via the first control line 14 to the control circuit 9. The masking circuit 21 has, as outputs, a fourth and fifth control line 7G, 77 which are respectively routed to a fourth, fifth and sixth memory/delay circuit 30, 31, 32.

The shift register 1 is connected to the fourth memory/delay circuit 30 via the first data line 11. The fourth memory/delay circuit 30 has, at one output, the second data line 12 that is routed to the fifth memory/delay circuit 31. The fifth memory/delay circuit 31 has, at an output, the fourth data line 15 that is routed to the sixth memory/delay circuit 32. The fourth, fifth and sixth memory/delay circuits 30, 31, 32 are connected, in each case via a data line, to a first, second or third data path circuit 40, 41, 42.

The first, second and third data path circuits 40, 41, 42 each have a first, second or third control input 72, 73, 74 to which a first, second or third control input 100, 101, 102 of a third control circuit 20 is connected. The third control circuit 20 controls the first, second and third data path circuits 40, 41, 42.

The first, second and third data path circuits 40, 41, 42 are connected via a first, second or third amplifier circuit 50, 51, 52 to the first, second or third data output 2, 4, 16. The data path circuits are line circuits with which data are conveyed from internal regions of the memory module 70 to the data outputs 2, 4, 16 that are disposed in edge areas of the memory module 70.

The circuit configuration according to FIG. 3 functions as now described.

If data are to be read out from the shift register 1 that constitutes a serial data memory, a read-out signal is fed to the control circuit 9 via the control input 17. In response, the control circuit 9 outputs an appropriate read signal via the first control line 14 to the shift register 1, the masking circuit 21 and the third control circuit 20. At the same time, clock signals are transmitted by the clock circuit 8 to the shift register 1 via the clock line 10 and to the masking circuit 21 at defined time intervals.

In one preferred embodiment, the clock circuit 8 can be driven by the clock input 89, so that the time which falls between the clock signals can be predefined from the outside, for example from a data-reading device.

After the clock signal CLK has been received, the shift register 1 outputs the first data item D1 via the first data line 11 in a way corresponding to that illustrated in FIG. 2. At the time t1, the first data item D1 is transmitted to the input of the fourth memory/delay circuit 30.

The read signal output by the control circuit 9 is passed on by the masking circuit 21 to the fourth, fifth and sixth memory/delay circuits 30, 31, 32 via the fourth control line 76. The masking circuit 21 passes on the clock signals of the clock circuit 8 via the fifth control line 77 only if a read signal is output by the control circuit 9 at the same time. If a read circuit is output by the control circuit 9 and if a clock signal arrives at the masking circuit 21 from the clock circuit 8 at the same time, the clock signal is passed on via the fifth control line 77 to the fourth, fifth and sixth memory/delay circuits 30, 31, 32.

The fourth, fifth and sixth memory/delay circuits 30, 31, 32 are preferably embodied as master/slave flip-flops and function as now described.

The data item supplied via the first, second or third data line 11, 12, 13 is output by the fourth, fifth and sixth memory/delay circuits 30, 31, 32 to the first, second or third data path circuit 40, 41, 42 if a read signal is fed via the fourth control line 76. At the same time, the supplied data item is stored. After a further clock signal CLK has been received, the stored data item is passed on via the second data line 12 or the third data line 15.

The method of operation of the fourth, fifth and sixth memory/delay circuits 30, 31, 32 is clarified on the timing diagram in FIG. 2. At the time t1, a read signal that is output by the control circuit 9 is present at the fourth, fifth and sixth memory/delay circuits 30, 31, 32. At the same time, a clock signal which has been output by the clock circuit 8 is fed to the fourth, fifth and sixth memory/delay circuit 30, 31, 32. In addition, the shift register 1 outputs the first data item D1 via the first data line 11.

After reception has occurred, the fourth memory/delay circuit 30 passes on the first data item D1 to the first data path circuit 40 and at the same time stores the first data item D1 in a buffer. There is no data item present at the data inputs of the fifth and sixth delay circuits 31, 32 so that no data item is fed to the second and third data path circuits 41, 42.

At the time t2, the clock circuit 8 outputs a further clock signal CLK which is passed on to the fourth, fifth and sixth memory/delay circuits 30, 31, 32. After the clock signal has been received, the shift register 1 outputs a second data item D2 to the fourth memory/delay circuit 30 via the first data line 11. After the second clock signal has been received, the fourth memory/delay circuit 30 passes on the buffered first data item D1 to the fifth memory/delay circuit 31 via the second data line 12.

After the second data item D2 has been received, the fourth memory/delay circuit 30 outputs the second data item D2 to the first data path circuit 40 and simultaneously stores the second data item D2 in a buffer.

The fifth memory/delay circuit 31 outputs the first data item D1 to the second data path circuit 41 at the time t2 and simultaneously stores the first data item D1 in a buffer.

In this way, at the time t2, the second data item D2 is present at the first data path circuit 40, and the first data item D1 is present at the second data path circuit 41.

After the next clock signal CLK has been received, the shift register 1 outputs the third data item D3 to the fourth memory/delay circuit 30. After the clock signal has been received, the fourth memory/delay circuit 30 passes on the buffered second data item D2 to the fifth memory/delay circuit 31. After the third data item D2 has been received, the fourth memory/delay circuit 30 passes on the third data item D3 to the first data path circuit 40 and simultaneously stores the third data item D3 in the buffer.

After the third clock signal has been received, the fifth memory/delay circuit 31 passes on the buffered first data item D1 to the sixth delay circuit 32 via the fourth data line 15. After the second item D2 has been received, the fifth memory/delay circuit 31 passes on the second data item D2 to the second data path circuit 41 and simultaneously stores the second data item D2 in the buffer.

After the first data item D1 has been received, the sixth memory/delay circuit 32 passes on the first data item D1 to the third data path circuit 42 and simultaneously stores the first data item D1 in a buffer.

Consequently, at the time t3, the third data item D3 is present at the first data path circuit 40, the second data item D2 is present at the second data path circuit 41 and the first data item D1 is present at the third data path circuit 42.

The third control circuit 20 receives, as does the shift register 1, the read signal from the control circuit 9 and in response outputs to the first, second and third data path circuits 40, 41, 42, via the first, second and third control lines 100, 101, 102, the signal to pass on a supplied data item to the first, second and third data output 2, 4, 16 via the first, second or third amplifier circuit 50, 51, 52. In this way, the data which are fed to the first, second and third data path circuits 40, 41, 42 are also present at the first, second and respectively third data outputs 2, 4, 16 with only a small delay.

The circuit configuration according to FIG. 3 is thus configured in such a way that the data corresponding to the signal profile on the second time axis A1 in FIG. 2 are present at the first data output 2. The data of the second data output 4 are present in the chronological sequence illustrated on the third time axis A2 in FIG. 2. The data corresponding to the fourth time axis A3 in FIG. 2 are present at the third data output 16.

The essential advantage of the circuit configuration in FIG. 3 over the circuit configuration in FIG. 1 consists in the fact that the data are not output directly to the data outputs 2, 4, 16 starting from the shift register 1 but are instead fed to the assigned data outputs 2, 4, 16 via appropriate data path circuits 40, 41, 42. The use of the data path circuits 40, 41, 42 which are already present in a semiconductor module provides the advantage that it is not necessary to route any separate data lines from the shift register 1 to the data outputs 2, 4, 16 but instead the data path circuits 40, 41, 42 which are present for reading out data on a memory chip are used. This permits efficient use of the data structure which is already present.

Figure 4:
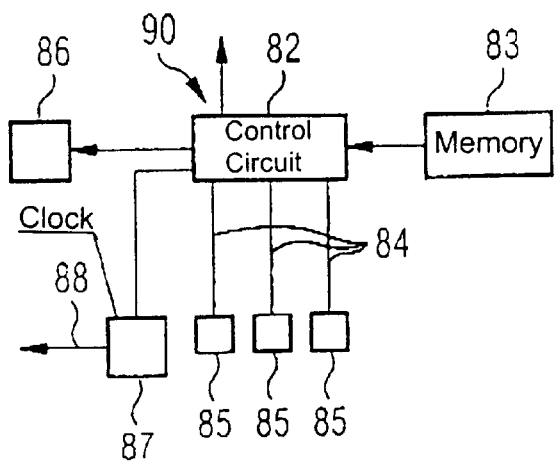
FIG. 4 is a block circuit diagram of a device for reading out data from the circuit configuration.

FIG. 4 shows a circuit configuration for a data-reading device such as is disposed, for example, in a test generator for testing the memory module 70. The data-reading device has a reading control circuit 82 that is connected to a data memory 83 and to an input device 86. The reading control circuit 82 is connected via data lines 84 to data inputs/outputs 85. In addition, a clock driver 87 is provided which is connected to the reading control circuit 82. The clock driver 87 has a clock output 88. In addition, the reading control circuit 82 has a control output 90.

In order to read out data from the circuit corresponding to FIG. 1 or FIG. 3, the data-reading device in FIG. 4 is connected as now described.

The control output 90 is connected to the control input 17 of the control circuit 9, and the clock output 88 is connected to the clock input 89 of the clock circuit 8. The operator of the data-reading device uses the input device 86 to enter the type of memory module to be tested. In the data memory 83, a list is stored in which, depending on the memory module, the number of data outputs 2, 4, 16, 7 which can be used for reading out data and the clock frequency of the clock circuit 8 of the memory module are stored.

The reading control circuit 82 uses the entire number of available data outputs if the number is smaller than the number of its own data inputs/outputs 85. If the memory module to be checked has, corresponding to FIG. 1, four data outputs and the data-reading device has, corresponding to FIG. 4, only three data inputs/outputs, the data-reading device uses only three data inputs/outputs 85 for reading out the data stored in the shift register 1. In this example, the three data inputs/outputs 85 are connected to the first, second and third data outputs 2, 4, 16. In addition, the data present at the first, second and third data outputs 2, 4, 16 are read out only every three timing clocks. The data are thus read out at the times t3, t6, t9, etc. This ensures that different data are present at each of the three outputs 2, 4, 16, and in addition none of the data which has been output by the shift register 1 is lost.

The time interval during which the data-reading device reads out the data thus corresponds to three times the timing clock between two clock signals.

If the memory module has, for example, just one data output 2, the data-reading device will use just one data input/output 85 for reading out the data and will connect it to the data output 2. In this example, the data are read out from the data output 2 at each clock signal of the clock circuit 8, with the result that all the data are read out serially via a data output.

In a further embodiment, the data inputs/outputs 85 that are to be used by the data-reading device are selected by the input device 86. In this case, an operator can define the number of data outputs 2, 4, 16, 7 which are to be interrogated. At the same time, the input device 86 can also be used to input into the clock circuit 8 the timing clock that is to be used by the memory module. The reading out of the data takes place in accordance with the method described, the number of data outputs used and the timing clock being adapted appropriately after the data have been interrogated.

The data-reading device according to FIG. 4 has essentially the advantage that the number of data inputs/outputs 85 via which data are read in can be adjusted. As a result, data can be read from circuit configuration with any desired number of existing data outputs. Furthermore, it is advantageous that the sampling times at which the reading control circuit 82 reads in data via the data inputs/outputs 85 can be set as a function of the number of data inputs/outputs 85 used, and can preferably be set to the timing clock of the circuit configuration to be interrogated.

Memory/delay circuits in the form of master/slave flip-flops are known, for example, from the reference Tietze, Schenk, Halbleiterschaltungstechnik [Semi-Conductor Circuit Technology], 9th edition, Springer Verlag, 1991 (ISBN 3-540-19475-4), on pages 235–240.

I claim:

1. An integrated circuit comprising a circuit configuration, said circuit configuration comprising:
    a serially readable data memory;
    a first data output to output data off the integrated circuit;
    an output line connecting said first data output to said data memory;
    a clock generator outputting clock signals;
    a clock line connecting said clock generator to said data memory;
    a second data output to output data off the integrated circuit; and
    a memory/delay circuit having an input connected to said output line and an output connected to said second data output, said data memory outputs a data item stored therein onto said output line when a clock signal is received from said clock generator, the data item output by said data memory is passed on, with a time delay, through said memory/delay circuit to said second data output.

2. The circuit configuration according to claim 1, wherein said memory/delay circuit is connected to said clock line, and said memory/delay circuit outputs the data item to said second data output with a delay of one clock signal.

3. The circuit configuration according to claim 1,
    wherein said memory/delay circuit is a first memory/delay circuit;
    including a third data output; and
    including a second memory/delay circuit having a first input connected to said output of said first memory/delay circuit, a second input connected to said clock line, and an output connected to said third data output, the data item supplied by said first memory/delay circuit is passed on, with a delay of one clock signal, by said second memory/delay circuit to said third data output.

4. The circuit configuration according to claim 1, including a data path circuit connected to said memory/delay circuit via which data are fed to said first data output and said second data output.

5. The circuit configuration according to claim 1, wherein said memory/delay circuit is a master-slave flip-flop circuit.

6. The circuit configuration according to claim 1, including:
    a control unit; and
    a control line connecting said control unit to said data memory, said control unit enables an outputting of the data item from said data memory with a predefined control signal.

7. The circuit configuration according to claim 1, including:
    a control unit; and
    a control line connecting said control unit to said memory/delay circuit, said control unit enables the passing on of the item data.

8. An integrated circuit comprising:
    a memory module; and
    a circuit configuration integrated on said memory module, said circuit configuration including:
        a serially readable data memory containing information relating to said memory module;
        a first data output to output data off the integrated circuit;
        an output line connecting said first data output to said data memory;
        a clock generator outputting clock signals;
        a clock line connecting said clock generator to said data memory;
        a second data output to output data off the integrated circuit; and
        a memory/delay circuit having an input connected to said output line and an output connected to said second data output, said data memory outputs a data item stored therein onto said output line when a clock signal is received from said clock generator, the data item output by said data memory is passed on, with a time delay, through said memory/delay circuit to said second data output.

9. A device for reading out data from a circuit configuration, the device comprising:
    a predefined number of data inputs through which the data can be read in;

a data memory; and a control circuit connected to said data memory and to said data inputs, said data memory defining which of said data inputs are active, and said control circuit reading in the data in parallel via said data inputs.

10. The device according to claim 9, wherein said data memory stores timing clock data that can be set and that said control circuit reads in the data in dependence on the timing clock data.

11. The device according to claim 9, wherein said data memory stores a clock time, and in that a clock period is calculated from the number of said data inputs multiplied by the clock time.

12. An integrated circuit comprising a circuit configuration, said circuit configuration comprising:

a serially readable data memory;

a first data output to output data off the integrated circuit and a second data output to output data off the integrated circuit;

an output line being connected to said data memory;

a clock generator outputting clock signals;

a clock line connecting said clock generator to said data memory;

a first and a second memory/delay circuit, said first memory/delay circuit having an input connected to said output line and an output connected to said first data output, said second memory/delay circuit having an input being connected to another output of said first memory/delay circuit and having an output connected to said second data output;

said data memory outputs a data item stored therein onto said output line when a clock signal is received from said clock generator, the data item output by said data memory being passed on, with a time delay, through said first memory/delay circuit to said second memory/delay circuit.

13. An integrated circuit according to claim 12, wherein a masking circuit is connected to said first and second memory/delay circuits, said masking circuit passing a clock signal to said first and second memory/delay circuits only if a read signal is provided to said masking circuit at the same time.

14. An integrated circuit according to claim 12, wherein a first data path circuit and a second data path circuit are connected between said first and second memory/delay circuits and said first and second data outputs, respectively, said first and second data path circuits are controlled in response to a read signal.

15. An integrated circuit according to claim 13, wherein a first data path circuit and a second data path circuit are connected between said first and second memory/delay circuits and the first and second data outputs, respectively, said first and second data path circuits being controlled in response to the read signal.

* * * * *